(12) United States Patent
Kuang et al.

(10) Patent No.: US 11,373,693 B2
(45) Date of Patent: Jun. 28, 2022

(54) METHOD FOR ADJUSTING READING SPEED OF MEMORY SYSTEM, COMPARISON CIRCUIT AND MEMORY SYSTEM

(71) Applicant: CHENGDU HAIGUANG INTEGRATED CIRCUIT DESIGN CO., LTD., Sichuan (CN)

(72) Inventors: Jente Benedict Kuang, Austin, TX (US); Yiping Zhang, Beijing (CN)

(73) Assignee: CHENGDU HAIGUANG INTEGRATED CIRCUIT DESIGN CO., LTD., Sichuan (CN)

(*) Notice: Subject to any disclaimer, the term of this patent is extended or adjusted under 35 U.S.C. 154(b) by 13 days.

(21) Appl. No.: 17/254,241

(22) PCT Filed: Dec. 30, 2019

(86) PCT No.: PCT/CN2019/129936
§ 371 (c)(1),
(2) Date: Dec. 18, 2020

(87) PCT Pub. No.: WO2021/134221
PCT Pub. Date: Jul. 8, 2021

(65) Prior Publication Data
US 2021/0398575 A1  Dec. 23, 2021

(51) Int. Cl.
*G11C 7/22* (2006.01)
*G11C 7/10* (2006.01)
*H03K 3/0233* (2006.01)

(52) U.S. Cl.
CPC ............ *G11C 7/222* (2013.01); *G11C 7/1066* (2013.01); *G11C 7/1093* (2013.01); *H03K 3/0233* (2013.01)

(58) Field of Classification Search
CPC ................................. G11C 7/222; G11C 7/22
USPC ...................................................... 365/233.1
See application file for complete search history.

(56) References Cited

U.S. PATENT DOCUMENTS

| 7,043,652 | B2 | 5/2006 | Matsui |
| 7,567,483 | B2 | 7/2009 | Kim |
| 7,751,261 | B2 | 7/2010 | Cho |
| 8,149,033 | B2 * | 4/2012 | Yoshizawa .............. H03L 7/093 327/158 |
| 8,775,761 | B2 | 7/2014 | Ok |

(Continued)

OTHER PUBLICATIONS

China National Intellectual Property Administration, International Search Report and Written Opinion, dated Sep. 27, 2020, 10 pages.

*Primary Examiner* — Muna A Techane
(74) *Attorney, Agent, or Firm* — Loeb & Loeb LLP

(57) ABSTRACT

The present disclosure relates to adjusting a reading speed of a memory system. A method for adjusting a reading speed of a memory system, including: generating an alternating sequence signal in which high levels and low levels appear alternately, associated with an output delay of the memory system; generating a reference signal having a predetermined frequency and a reference delay; generating a comparison result signal indicating a range of a difference between an output delay and the reference delay based on an alternating sequence signal and a reference signal; and determining whether a value indicated by a comparison result signal is a predetermined value, so as to adjust the reading speed of the memory system based on a determination result.

20 Claims, 12 Drawing Sheets

(56) References Cited

U.S. PATENT DOCUMENTS

| | | | | |
|---|---|---|---|---|
| 2003/0026162 A1* | 2/2003 | Matsui | ................... | G11C 7/222 |
| | | | | 365/233.11 |
| 2008/0080263 A1* | 4/2008 | Kim | ...................... | G11C 7/222 |
| | | | | 365/194 |
| 2010/0299644 A1* | 11/2010 | Kawai | .................. | G11C 7/1051 |
| | | | | 716/113 |
| 2015/0055415 A1 | 2/2015 | Yamamoto et al. | | |
| 2017/0062050 A1* | 3/2017 | Baek | ................. | H03K 19/0005 |

\* cited by examiner

METHOD FOR ADJUSTING READING SPEED OF MEMORY SYSTEM, COMPARISON CIRCUIT AND MEMORY SYSTEM

CROSS-REFERENCE TO RELATED APPLICATION

This application is an US National Phase application claiming priority to the PCT International Application PCT/CN2019/129936, filed on Dec. 30, 2019. For all purposes, the entire disclosure of the aforementioned application is incorporated by reference as part of the disclosure of this application.

TECHNICAL FIELD

The present disclosure relates generally to storage, and more specifically, to a method for generating a comparison result signal indicating a range of a difference between an output delay of a memory system and a reference delay, a comparison circuit, a method for adjusting a reading speed of a memory system, a memory system, and a method for operating the memory system.

BACKGROUND

In recent years, in order to improve the data processing speed of an information processing device, the operating frequency of a memory system has become higher and higher. This means that when the reading speed of the memory system becomes higher and the output delay of a data output signal becomes smaller, the power consumption of the memory system will become larger.

SUMMARY

According to an aspect of the present disclosure, a method for generating a comparison result signal indicating a range of a difference between an output delay of a memory system and a reference delay is provided. The method comprises: generating an alternating sequence signal in which high levels and low levels appear alternately, associated with an output delay; generating a reference signal having a predetermined frequency and the reference delay; and generating a comparison result signal based on an alternating sequence signal and a reference signal.

According to an aspect of the present disclosure, a method for adjusting a reading speed of a memory system is provided. The method comprises: generating an alternating sequence signal in which high levels and low levels appear alternately, associated with an output delay of the memory system; generating a reference signal having a predetermined frequency and a reference delay; generating a comparison result signal indicating a range of a difference between an output delay and the reference delay based on an alternating sequence signal and a reference signal; and determining whether a value indicated by a comparison result signal is a predetermined value, so as to adjust the reading speed of the memory system based on a determination result.

According to an aspect of the present disclosure, a memory system is provided. The memory system comprises: a memory, comprising a plurality of memory cells, and configured to output an alternating sequence signal having an output delay, a reference signal generating circuit, configured to generate a reference signal having a predetermined frequency and a reference delay, a comparison circuit, configured to receive an alternating sequence signal in which high levels and low levels appear alternately associated with the output delay and a reference signal, and to generate a comparison result signal indicating a range of a difference between the output delay and the reference delay based on an alternating sequence signal and the reference signal, and a delay control signal generating circuit, configured to generate a delay control signal used for adjusting an output delay of the memory system based on a comparison result signal. The memory receives a delay control signal.

According to an aspect of the present disclosure, a method for adjusting a reading speed of a memory system is provided. The method comprises: connecting the memory system to a comparison circuit, and adjusting the reading speed of the memory system until a value indicated by a comparison result signal is a predetermined value. The comparison circuit receives an alternating sequence signal in which high levels and low levels appear alternately, associated with an output delay of the memory system and a reference signal having a reference delay, and generates a comparison result signal indicating a range of a difference between an output delay and the reference delay based on an alternating sequence signal and a reference signal. The reference signal is a signal having a predetermined frequency.

According to an aspect of the present disclosure, a method for operating the memory system described above is provided. The method comprises: determining whether the memory system is in one of the following predetermined situations that: a data reading state is to be in a non-speed adjustment reading state, a rate of change of a voltage at a power supply input terminal of the memory system is greater than a predetermined rate threshold; a voltage at a power supply input terminal is outside a voltage range corresponding to a current output delay, and a time period from a current time point to a previous time point when a reading speed of the memory system was adjusted last time is greater than a predetermined time period threshold.

According to another aspect of the present disclosure, a comparison circuit for generating a comparison result signal indicating a range of a difference between an output delay of a memory system and a reference delay is provided. The comparison circuit is configured to receive an alternating sequence signal in which high levels and low levels appear alternately associated with an output delay, to receive a reference signal having a predetermined frequency and the reference delay, and to generate a comparison result signal based on an alternating sequence signal and a reference signal. The memory system outputs a data signal with the output delay when a reading operation is performed on the memory system.

BRIEF DESCRIPTION OF THE DRAWINGS

Embodiments of the present disclosure are described below with reference to the accompanying drawings, which will facilitate understanding of the above and other objects, features and advantages of the present disclosure. The drawings are only for the purpose of illustrating the principles of the present disclosure. The dimensions and relative positions of the units are not necessarily drawn to scale in the drawings. In the drawings.

DETAILED DESCRIPTION

Figure 1:
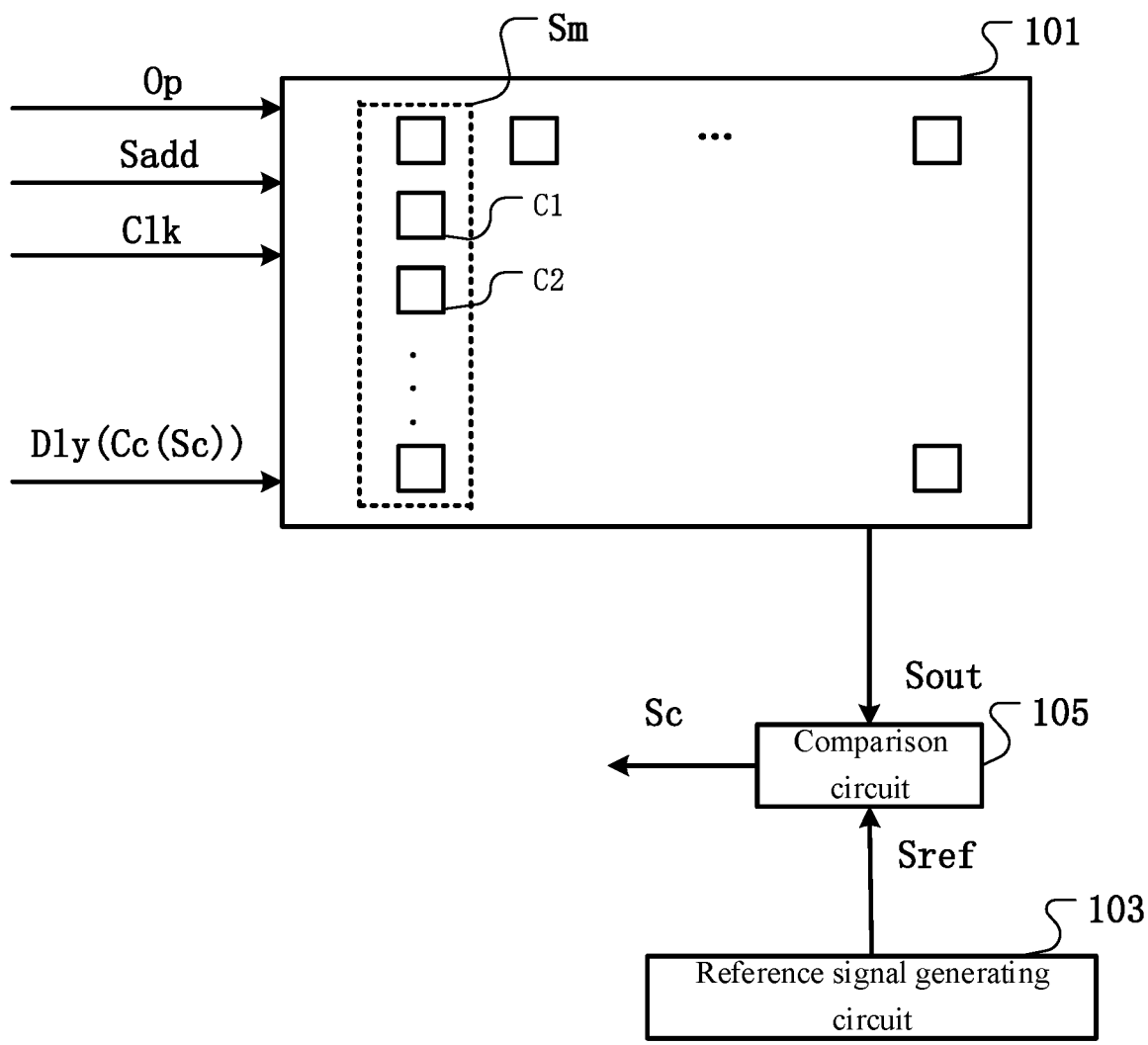
FIG. 1 is an exemplary block diagram of a memory system according to an embodiment of the present disclosure.

Exemplary embodiments of the present disclosure will be described below with reference to the accompanying drawings. For clarity and conciseness, not all features of actual embodiments are described in the specification. However, it should be understood that during the development of any such actual embodiments, a number of decisions particular to an embodiment may be made in order to achieve developers' specific goals, and these decisions may vary from an embodiment to another embodiment.

Here, it should also be noted that, in order to avoid obscuring the present disclosure due to unnecessary details, only features closely related to the schemes of the present disclosure are illustrated in the drawings, and other details not closely related to the present disclosure are omitted.

It should be understood that the present disclosure is not limited to the described embodiments due to the following description with reference to the accompanying drawings. Herein, the embodiments may be combined with each other, the order of some steps may be interchanged, the features between different embodiments may be replaced or borrowed, one or more features may be omitted in an embodiment, and the above changes should fall within the scope of the present disclosure.

An excessively high reading speed of a memory system will lead to excessively high power consumption of the memory system. In some cases, the excessively high reading speed is not required, thus it is desirable that the reading speed is adjustable. In addition, the excessively high reading speed can also reduce the yield of the memory system. The objects of the present disclosure include, but are not limited to, generating a comparison result signal indicating a range of a difference between an output delay of a memory system and a reference delay, and adjusting a reading speed of the memory system as needed.

The inventors have found that it is beneficial to adjust the reading speed of the memory system as needed. By adjusting the reading speed of the memory system, the appropriate power can be maintained, the yield of products can be improved, the accuracy of output data can be improved, and the compromise between the yield, the dynamic power and the reading speed can be implemented. Based on the above concept, the inventor designed technical schemes of the present disclosure.

By means of the technical schemes of the present disclosure, at least one of the following effects can be implemented: determining a comparison result signal indicating a range of a difference between a current output delay and a reference delay, adjusting a reading speed of a memory system, reducing the power consumption of the memory system, improving the reading speed of the memory system, improving the yield of the memory system, and implementing the compromise between the reading speed and the yield, and the compromise between the reading speed and the dynamic power.

According to an aspect of the present disclosure, a memory system with a reading speed adjustable is provided. The memory system may include, for example, a cache, a memory bank, a memory card, or a solid state disk. The memory system is described below with reference to FIG. 1.

FIG. 1 is an exemplary block diagram of a memory system 100 according to an embodiment of the present disclosure. The memory system 100 includes a memory 101, a reference signal generating circuit 103, and a comparison circuit 105. The memory 101 includes a plurality of memory cells and control logic units. The memory cells are, for example, semiconductor memory cells such as SRAM (Static Random Access Memory) or DRAM (Dynamic Random Access Memory) types. The memory system 100 may also include a memory controller (not illustrated in the drawings).

Figure 2:
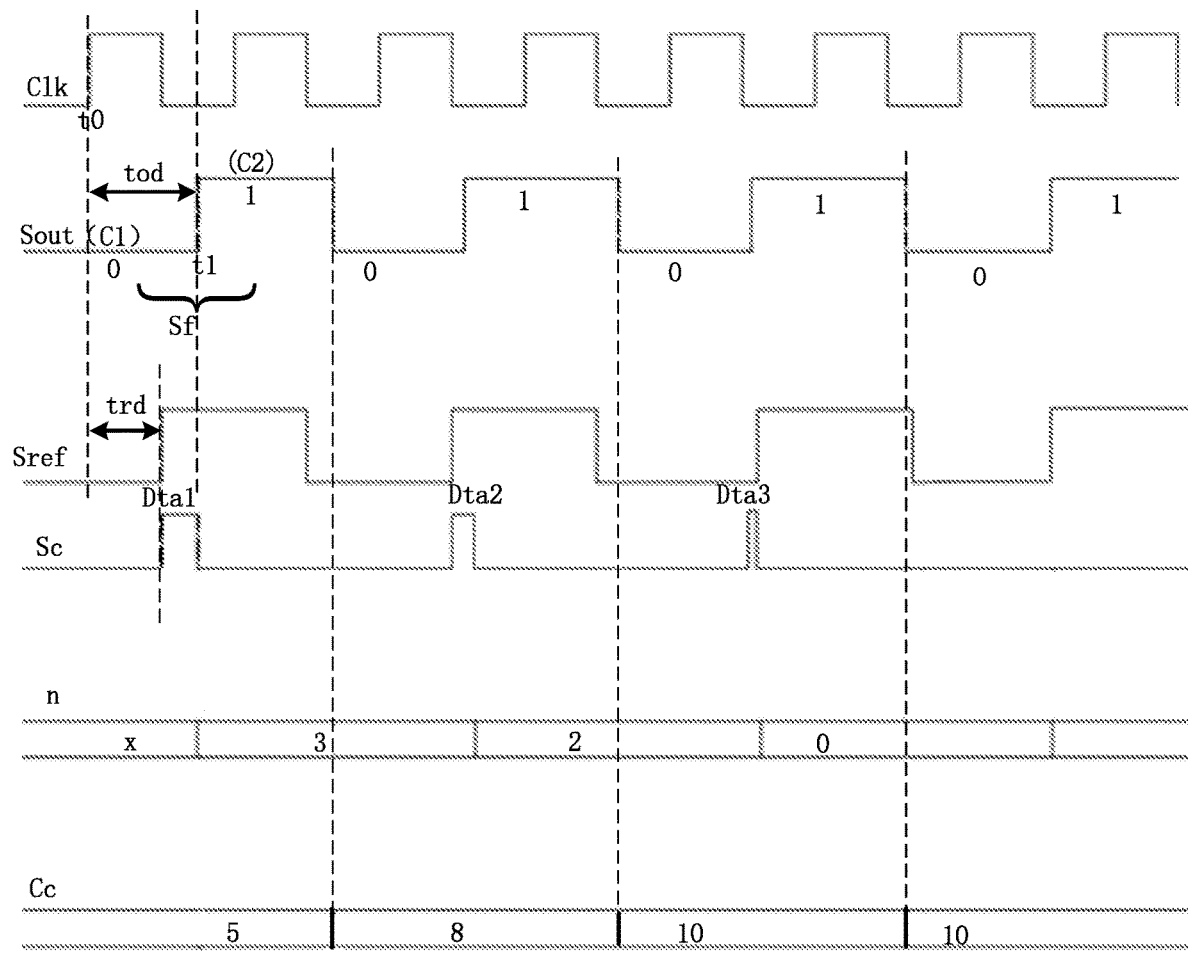
FIG. 2 illustrates a schematic diagram of changes in related signals and parameters over time, when adjusted, according to a method for adjusting a reading of a memory system according to an embodiment of the present disclosure.

FIG. 2 illustrates a schematic diagram of changes of related signals and parameters over time, when adjusted, according to a method for adjusting a reading of a memory system according to an embodiment of the present disclosure.

As illustrated in FIG. 1, signals received by the memory 101 include an operation instruction Op, an address signal S add, a clock signal Clk, and a delay control signal Dly. The memory 101 includes a plurality of memory cells. In FIG. 1, the plurality of memory cells are schematically illustrated by a plurality of blocks. Each memory cell has a corresponding address Add. After the reading instruction Op of reading a memory cell corresponding to an address Add is issued to the memory 101, and after a certain delay time, the memory 101 outputs a data signal indicating the stored data in the memory cell corresponding to the address Add, in response to the reading instruction. If a predetermined memory cell sequence in which the stored data is alternately binary "0" and "1" is read directly adjacently in time, an alternating sequence signal Sout in which "0" data signal and "1" data signal appear alternately (i.e., high levels and low levels appear alternately) may be obtained, and accordingly, the alternating sequence signal Sout has a level-flipped flipping portion Sf (see FIG. 2). An output delay may be determined based on the flipping portion Sf. In the present disclosure, a memory cell may refer to a memory bit that stores a binary bit. Two types of data may be stored in the memory bit: data "0" and data "1". Signals input to the memory 101 illustrated in FIG. 1 include an address signal Sadd. The memory 101 also receives a clock signal Clk in order to synchronize the memory. Referring to FIG. 2, the clock signal Clk may be a square wave having a fixed period p and a duty ratio of 50%. The clock signal Clk has rising edges and falling edges, respectively corresponding to rising flipping time points and falling flipping time points. A delay control signal Dly may determine an output delay tod. The output delay tod of the memory 101 is controlled by the delay control signal Dly among input signals thereof, that is, different delay control signals Dly result in different output delays tod.

The reference signal generating circuit 103 may generate a reference signal Sref having a predetermined frequency and a reference delay trd. Referring to FIG. 2, the reference signal Sref may be a square wave having a fixed period p and a duty ratio of 50%. The period of the reference signal Sref is, for example, 2p or np, and n is an integer greater than 2. Referring to FIG. 2, the reference delay trd may be defined as: a time period corresponding to a difference between a flipping time point of the reference signal (e.g., a rising flipping time point) and a flipping time point of the clock signal Clk.

The comparison circuit 105 may receive an alternating sequence signal Sout associated with an output delay tod of the memory system. The comparison circuit 105 may also receive a reference signal Sref. The comparison circuit 105 may also generate a comparison result signal Sc corresponding to the difference Dta between the output delay tod of the memory system and a reference delay trd of the reference output signal Sref based on the alternating sequence signal Sout and the reference signal Sref. A time period corresponding to the difference Dta (e.g., Dta1, Dta2 and Dta3) is illustrated in FIG. 2, and the length of the time period corresponds to the width of a rectangular pulse in the signal. When the absolute value of Dta approaches zero and is too small, the rectangular pulse is not illustrated any more in the drawings. In addition, it should be understood that the difference Dta may correspond to a phase difference between a comparison signal and a reference signal. In FIG. 1, when a reading operation is performed on a predetermined memory cell sequence in the memory 101, the memory outputs an alternating sequence signal Sout with an output delay tod. For example, when the read data stored in a memory cell is a first binary number (e.g., "1"), the waveform of the data signal presents a high level state, and when the read data stored in the memory cell is a second binary number (e.g., "0"), the waveform of the data signal presents a low level state. In this embodiment, the alternating sequence signal Sout is composed of alternating high and low level data signals. An exemplary output delay tod is defined as: tod=t1−t0, referring to FIG. 2, where t0 is the time point when the clock signal Clk indicates the start of reading (e.g., a time point corresponding to a rising edge), and t1 is the time point when a signal corresponding to the read data of the memory cell starts to occur at a data output terminal of the memory.

The delay control signal Dly are described below. In a case where the value indicated by a comparison result signal Sc is not a predetermined value, an adjusted delay control signal Dly is generated based on the comparison result signal Sc, so that the respective adjusted output delay tod approaches a reference delay trd or enters a predetermined range, for example, the output delay tod is close enough to the reference delay trd. As illustrated in FIG. 2, based on the comparison result signal Sc corresponding to the different difference Dta (e.g., Dta1, Dta2 and Dta3), the delay control signal Dly is adjusted in order to change the output delay corresponding to the alternating sequence signal Sout, so that the difference Dta approaches zero, that is, the output delay tod approaches the reference delay trd or enters the predetermined range. The adjusted delay control signal Dly may be generated base on control code Cc. That is, appropriate control code Cc is generated based on the comparison result signal Sc, and the delay control signal Dly is generated using the control code Cc. The delay control signal input to the memory may be generated, for example, by a control signal generator integrated in the memory system 100.

An example of generating the control code Cc is illustrated in FIG. 2. An adjustment parameter n is determined based on the comparison result signal Sc, and the control code Cc for generating a delay control signal is determined based on the adjustment parameter n. For example, Cc=Cc'+n, where Cc' represents the current control code. In a case where the current control code Cc'=5 and the adjustment parameter n=3, the next control code Cc=5+3=8. As can be seen from FIG. 2, the difference Dta tends to be smaller and smaller, and the adjustment parameter n correspondingly becomes smaller and smaller. In a case where the adjustment parameter n is zero, it is indicated that the current output delay tod has satisfied the predetermined reading speed requirement, the current control code Cc may be stored, and the operation of adjusting the reading speed may be stopped (e.g., the comparison circuit is instructed to stop working). After obtaining the control code Cc satisfying the predetermined reading speed requirement, conventional data reading may be performed at the reading speed determined by the stored control code Cc. Changes in the difference Dta, the adjustment parameter n and the control code Cc are illustrated in FIG. 2.

FIG. 1 also illustrates a set of memory cells Sm composed of a predetermined memory cell sequence. The set of memory cells Sm is used to adjust the reading speed. During the adjustment of the reading speed, before a reading operation is performed, the stored data of a plurality of memory cells (including a first memory cell C1 and a second memory cell C2) in the set of memory cells Sm in the memory 101 for adjusting the reading speed of the memory system may be provided, so that the data sequence of the respective stored data in the plurality of memory cells alternately presents a first binary number and a second binary number which is different from the first binary number when the plurality of memory cells in the set of memory cells Sm are sorted by the predetermined memory cell sequence. For example, the first memory cell C1 and the second memory cell C2 are adjacent to each other in the predetermined memory cell sequence, and the binary number stored in the first memory cell C1 is different from that in the second memory cell C2. For example, the set of memory cells Sm is a column of memory cells in the memory 101, constituting the predetermined memory cell sequence in a top-to-bottom arrangement order, and when reading each memory cell of the set of memory cells Sm in a predetermined memory cell sequence order, a data sequence in which 0 and 1 appear alternately is obtained. The alternating sequence signal Sout having a flipping portion Sf can be seen from FIG. 2, and the alternating sequence signal Sout corresponds to the data sequence in which 0 and 1 appear alternately. It can be seen that the alternating sequence signal Sout may be generated by reading, directly adjacently in time, two memory bits in the memory system in which the stored data is different.

Memory cells in the set of memory cells Sm may be ordinary memory cells, and in addition to adjusting the reading speed, these memory cells may also be used to store general data. In this way, the effective storage capacity of the memory may be improved. Alternatively, the plurality of memory cells in the set of memory cells Sm may also be reserved memory cells dedicated to adjusting operating parameters of the memory system, and these reserved memory cells are not used for storing general data. Such a set of memory cells Sm may be provided when the memory is produced or detected. In order to adjust the reading speed of the memory system, the first binary number and the second binary number may be alternately stored in the respective memory cells in the predetermined memory cell sequence order. The read-write period of the reserved memory cells is the same or substantially the same as that of other memory cells in the memory. In this way, it helps to reduce the time consuming for adjusting the reading speed. When adjusting the reading speed of the memory system, reading operations may be performed on the memory in the predetermined cell sequence order. The read-write period of the reserved memory cells is the same or substantially the same as that of other memory cells in the memory.

The reference signal Sref may be generated by a digital signal generator or by a memory controller integrated with the digital signal generator, and the controller may control the operations of the memory.

It should be understood that various implementations may be designed for the comparison circuit of the present disclosure, according to the above description of the comparison circuit. As an exemplary implementation, the comparison circuit may be implemented using various flip-flops such as D flip-flops.

A comparison circuit using 5 D flip-flops are described below.

Figure 3:
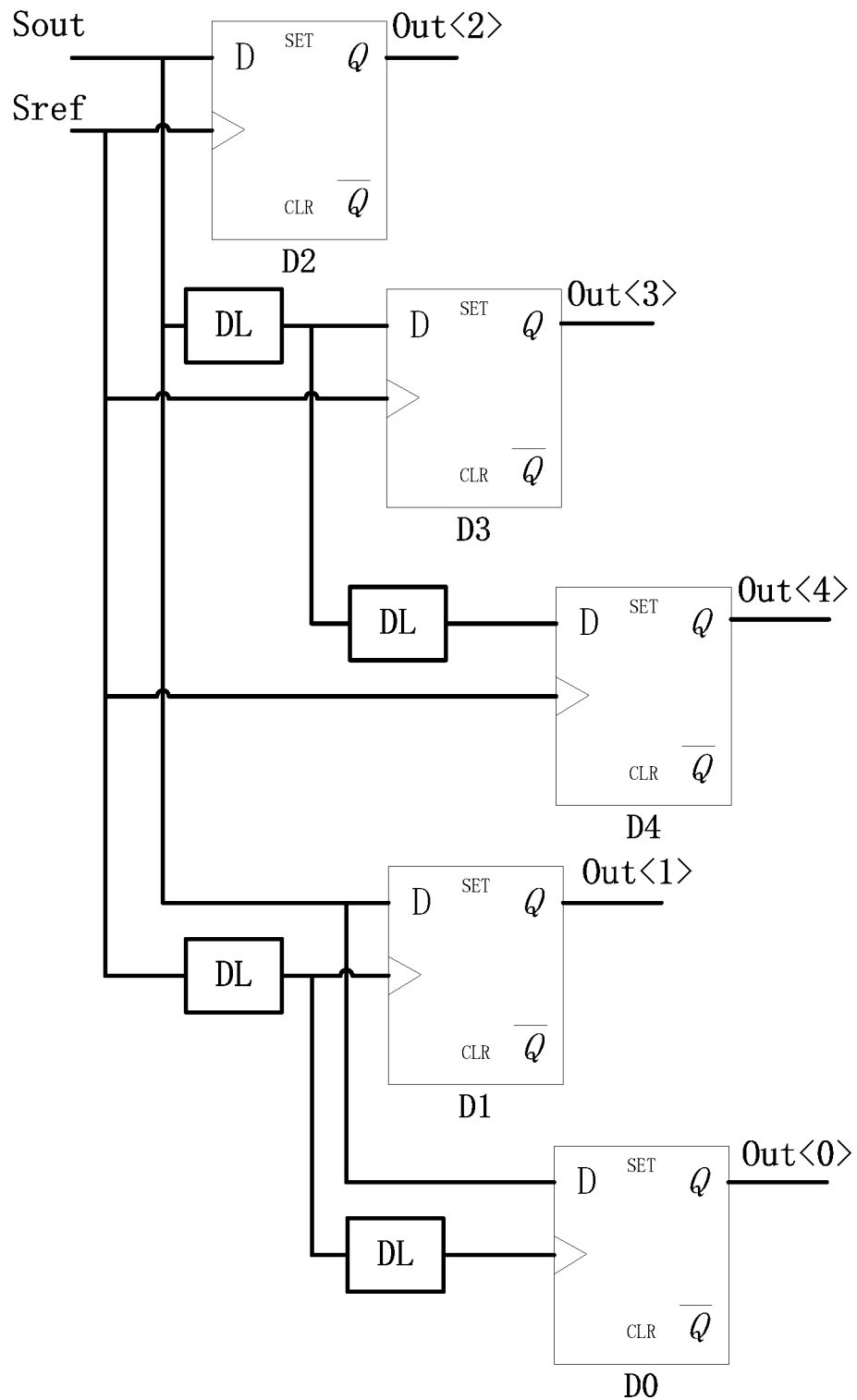
FIG. 3 is a schematic diagram of a comparison circuit according to an embodiment of the present disclosure.

FIG. 3 is a schematic diagram of a comparison circuit 305 according to an embodiment of the present disclosure. In FIG. 3, the comparison circuit 305 includes 5 D flip-flops: D flip-flop D0, D flip-flop D1, D flip-flop D2, D flip-flop D3, and D flip-flop D4. Output signals of the 5 D flip-flops are respectively: Out<0>, Out<1>, Out<2>, Out<3> and Out<4>. The comparison circuit 305 further includes a plurality of identical delay units DL, and each delay unit may delay an input signal by a delay time T (e.g., 2 picoseconds) and output it. T may be used as a unit to measure the time length of an output delay, and T is a positive value. As illustrated in FIG. 3, a first input terminal of each D flip-flop receives an alternating sequence signal Sout or a delayed signal of the alternating sequence signal Sout; and a second input terminal of each D flip-flop receives a reference output signal Sref or a delayed signal of the reference output signal Sref. The comparison circuit 305 may generate a comparison result signal Sc indicating a range of the difference Dta between an output delay tod of the alternating sequence signal Sout and a reference delay trd of the reference output signal Sref. In FIG. 3, a permutation and combination signal Out<4:0> of the outputs Out<4>, Out<3>, Out<2>, Out<1> and Out<0> of the 5 D flip-flops may be taken as the comparison result signal Sc.

TABLE 1

| Comparison result signal | | |
|---|---|---|
| Out<4:0> | Dta range | n |
| 11111 | Below −2T (e.g. −2.5T) | −2 |
| 01111 | Between −T and −2T (e.g. −1.5T) | −1 |
| 00111 | Between −T and 0 (e.g. −0.5T) | 0 |

TABLE 1-continued

| Comparison result signal | | |
|---|---|---|
| Out<4:0> | Dta range | n |
| 00011 | Between 0 and T (e.g. 0.5T) | 1 |
| 00001 | Between T and 2T (e.g. 1.5T) | 2 |
| 00000 | Above 2T (e.g. 2.5T) | 3 |

Table 1 illustrates permutation and combination signals Out<4:0> under different difference Dta. As can be seen from Table 1, different difference Dta ranges correspond to different permutation and combination signals Out<4:0>. Therefore, the delay control signal generating circuit generating a delay control signal input to the memory may generate a delay control signal Dly based on the permutation and combination signal Out<4:0> in order to adjust the reading speed of the memory system. When the difference Dta is between 0 and −T, it is considered that the current output delay tod satisfies needs, and a data reading operation may be performed using the current delay control signal Dly (corresponding to the current output delay tod). T is referred to as a predetermined time period in the present disclosure, and −T is referred to as a predetermined negative value in the present disclosure. In Table 1, n is an integer type adjustment parameter, and different adjustment parameters n have corresponding relationships with different comparison result signals Sc and different ranges. In a case where the value indicated by the comparison result signal Sc is not a predetermined value (e.g., 00111), the output delay tod may be adjusted based on the comparison result signal Sc, and the delay control signal Dly resulting in the output delay adjusted based on the comparison result signal Sc may be generated. The output delay tod corresponding to the generated delay control signal Dly satisfies: tod=tod'−nT, and tod' is the previous output delay. That is, the output delay is adjusted with a predetermined time period T which is the minimum adjustment step. When the output delay is adjusted, depending on the different comparison circuit used, the adjusted delay control signal may be generated each time based on the comparison result signal, so that the output delay is always decreased or increased by the predetermined time period. Alternatively, during the adjustment, n is varied, so that the output delay corresponding to the adjusted delay control signal differs from the previous output delay by n multiple of the predetermined time period, where n is an integer and n≥1. When the difference Dta is in an intermediate range between boundary ranges (for example, the intermediate range in Table 1: −T to −2T, 0 to −T, 0 to T or T to 2T), n is equal to the value obtained by rounding Dta up. When the difference Dta is within the boundary range (for example, the boundary range in Table 1: below −2T or above −2T), n is equal to the predetermined minimum adjustment parameter or maximum adjustment parameter, that is, when the difference Dta is within an upper boundary range, n is made to equal to the predetermined maximum adjustment parameter (for example, 3 in Table 1), and when the difference Dta is within a lower boundary range, n is made to equal to the predetermined minimum adjustment parameter (for example, −2 in Table 1). In the present disclosure, when n=0, the current output delay tod is not adjusted. When the previous output delay tod' is too large (e.g., tod'=8.6T, trd=4.0T, Dta=4.6T), the output delay is adjusted in a decreasing manner (e.g., tod=tod'−3T=1.6T, n=3); and when the previous output delay tod' is too small (e.g., tod'=2.6T, trd=4.0T, Dta=−1.6T), the output delay is adjusted in an increasing manner (e.g., tod=tod'−(−T)=3.6T, n=−1). That is, in a case where the difference Dta is outside the range of 0 to −T, the delay control signal Dly may be generated in such a manner to satisfy the following condition: the current output delay tod corresponding to the delay control signal Dly differs from the previous output delay tod' by an integer multiple of the predetermined negative value, where the integer is related to the difference Dta and the comparison result signal Sc, and is specifically selected as the adjustment parameter n. In this example, a large number of flip-flops are used in the comparison circuit 305, which helps to quickly adjust the output delay to a predetermined target.

As another example, a comparison circuit using 3 D flip-flops is described below.

TABLE 2

| Comparison result signal | | |
|---|---|---|
| Out<2:0> | Dta range | n |
| 111 | Below −T (e.g. −1.5T) | −1 |
| 011 | Between 0 and −T (e.g. −0.5T) | 0 |
| 001 | Between 0 and T (e.g. 0.5T) | 1 |
| 000 | Above T (e.g. 1.5T) | 2 |

Figure 4:
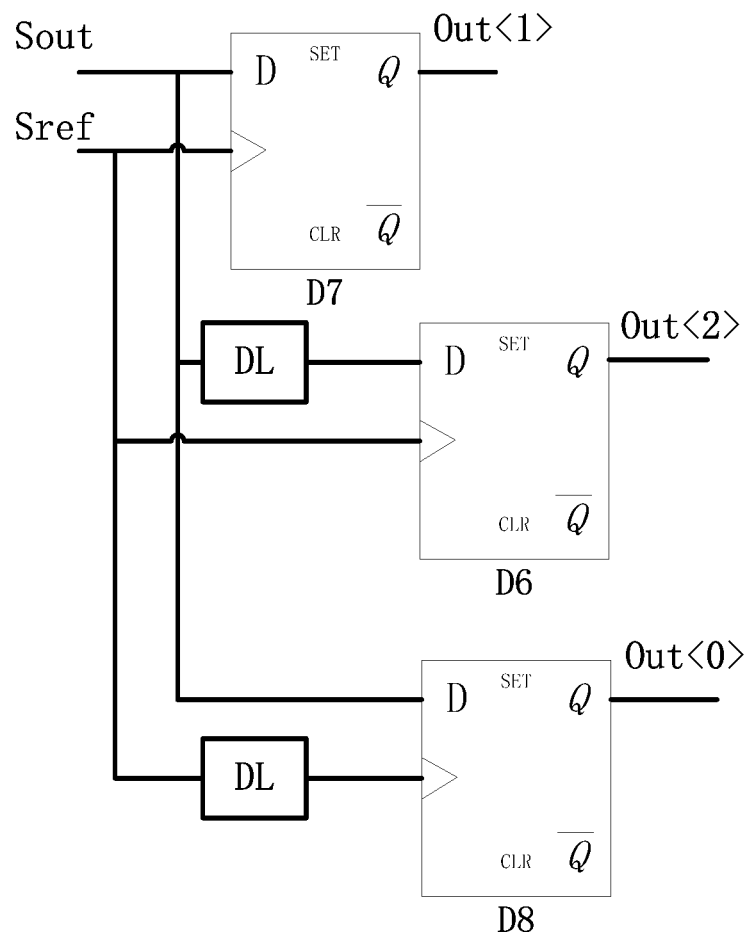
FIG. 4 is a schematic diagram of a comparison circuit according to another embodiment of the present disclosure.

FIG. 4 is a schematic diagram of a comparison circuit 405 according to an embodiment of the present disclosure. In FIG. 4, the comparison circuit 405 includes 3 D flip-flops: D flip-flop D8, D flip-flop D7 and D flip-flop D6. Output signals of the 3 D flip-flops are respectively: Out<0>, Out<1> and Out<2>. The comparison circuit 405 further includes two identical delay units DL, and each delay unit may delay an input signal by a delay time T and output it. As illustrated in FIG. 4, a first input terminal of each D flip-flop receives an alternating sequence signal Sout or a delayed signal of the alternating sequence signal Sout; and a second input terminal of each D flip-flop receives a reference output signal Sref or a delayed signal of the reference output signal Sref. The comparison circuit 405 may generate a comparison result signal Sc indicating a range of the difference Dta between an output delay tod of the alternating sequence signal Sout and a reference delay trd of the reference output signal Sref. In FIG. 4, a permutation and combination signal Out<2:0> of the outputs Out<2>, Out<1> and Out<0> of the 3 D flip-flops may be taken as the comparison result signal Sc.

Table 2 illustrates permutation and combination signals Out<2:0> under different difference Dta. As can be seen from Table 2, different difference Dta ranges correspond to different permutation and combination signals Out<2:0>. Therefore, the delay control signal generating circuit may generate the delay control signal Dly based on the permutation and combination signal Out<2:0> in order to adjust the reading speed of the memory system. In Table 2, n is an integer type adjustment parameter corresponding to the comparison result signal Sc one by one, and the adjustment parameter n may indicate the range in which the difference Dta lies. Like the comparison circuit 305, the comparison circuit 405 may also be used to adjust the reading speed of the memory system according to the equation tod=tod'−nT. Compared with the comparison circuit 305 illustrated in FIG. 3, the comparison circuit 405 has a simpler structure and saves cost, however, the speed of adjusting the output delay to the predetermined target is slower.

As another example, a comparison circuit using 2 D flip-flops is described below.

TABLE 3

| Comparison result signal | | |
|---|---|---|
| Out<1:0> | Dta range | n |
| 11 | Below −T (e.g. −1.5T) | −1 |
| 01 | Between 0 and −T (e.g. −0.5T) | 0 |
| 00 | Above 0 (e.g. 0.5T) | 1 |

Figure 5:
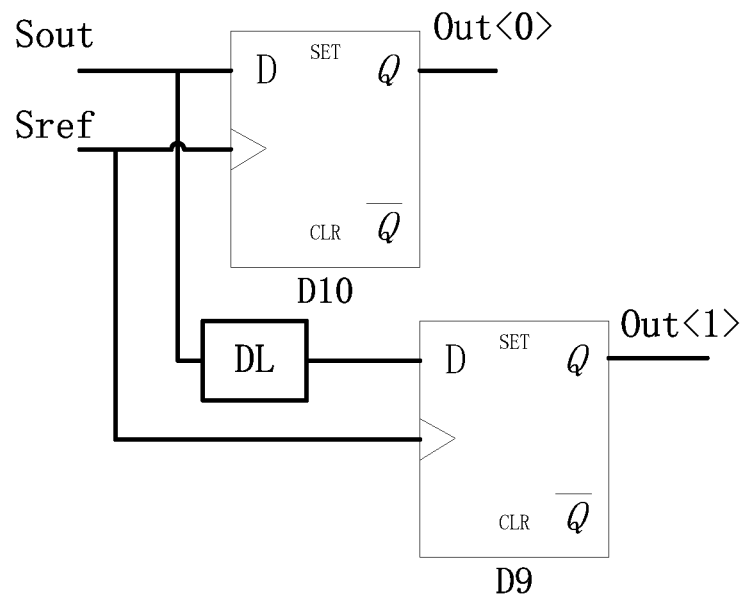
FIG. 5 is a schematic diagram of a comparison circuit according to still another embodiment of the present disclosure.

FIG. 5 is a schematic diagram of a comparison circuit 505 according to an embodiment of the present disclosure. In FIG. 5, the comparison circuit 505 includes 2 D flip-flops: D flip-flop D10 and D flip-flop D9. Output signals of the 2 D flip-flops are respectively: Out<0> and Out<1>. The comparison circuit 505 further includes 1 delay unit DL, and the delay unit may delay an input signal by a delay time T and output it. As illustrated in FIG. 5, a first input terminal of each D flip-flop receives an alternating sequence signal Sout or a delayed signal of the alternating sequence signal Sout; and a second input terminal of each D flip-flop receives a reference output signal Sref. The comparison circuit 405 may generate a comparison result signal Sc and the comparison result signal Sc indicates a range of the difference Dta between an output delay tod of the alternating sequence signal Sout and a reference delay trd of the reference output signal Sref. In FIG. 5, a permutation and combination signal Out<1:0> of the outputs Out<1> and Out<0> of the tow D flip-flops may be taken as the comparison result signal Sc.

Table 3 illustrates permutation and combination signals Out<1:0> under different difference Dta. As can be seen from Table 3, different difference Dta ranges correspond to different permutation and combination signals Out<1:0>. Therefore, the delay control signal generating circuit may generate the delay control signal Dly based on the permutation and combination signal Out<1:0> in order to adjust the reading speed of the memory system. In Table 3, n is an integer type adjustment parameter corresponding to the comparison result signal Sc one by one, and n may indicate the range in which the difference Dta lies. Like the comparison circuit 305, the comparison circuit 505 may also be used to adjust the reading speed of the memory system according to the equation tod=tod'−nT. Compared with the comparison circuit 305 and the comparison circuit 405, the comparison circuit 505 is simpler and has an advantage in saving cost.

It should be understood that whether each range of Dta includes endpoints may be freely set, as long as each Dta can fall into a unique range. For example, for the comparison circuit 505 in FIG. 5, the three ranges of Dta may be defined as: Dta>0, −T<Dta≤0 and Dta≤−T; or Dta≥0, −T≤Dta<0 and Dta<−T.

From the above description, it should be understood that the comparison circuit in the present disclosure may include at least two flip-flops. A second input terminal of each flip-flop receives a reference output signal or a delayed signal of the reference output signal. A first input terminal of each flip-flop receives a data output signal or a delayed signal of the data output signal. A delayed signal is generated by a delay unit. A delay time of each delay unit may be T, and may be different. Considering scalability and simplifying operation logic, optionally, the delay units having the same delay time may be used. Although the delay units in FIGS. 3, 4 and 5 have the same delay amount, the present disclosure is not limited to this situation, and the delay units used in the comparison circuit may also have different delay amounts, for example, 1 delay unit is used to implement the delay effects of 2 delay units DL connected in series.

The memory system 100 may also be deformed. Examples of a memory system obtained by deforming the memory system 100 are described below with reference to FIGS. 6, 7, and 8.

Figure 6:
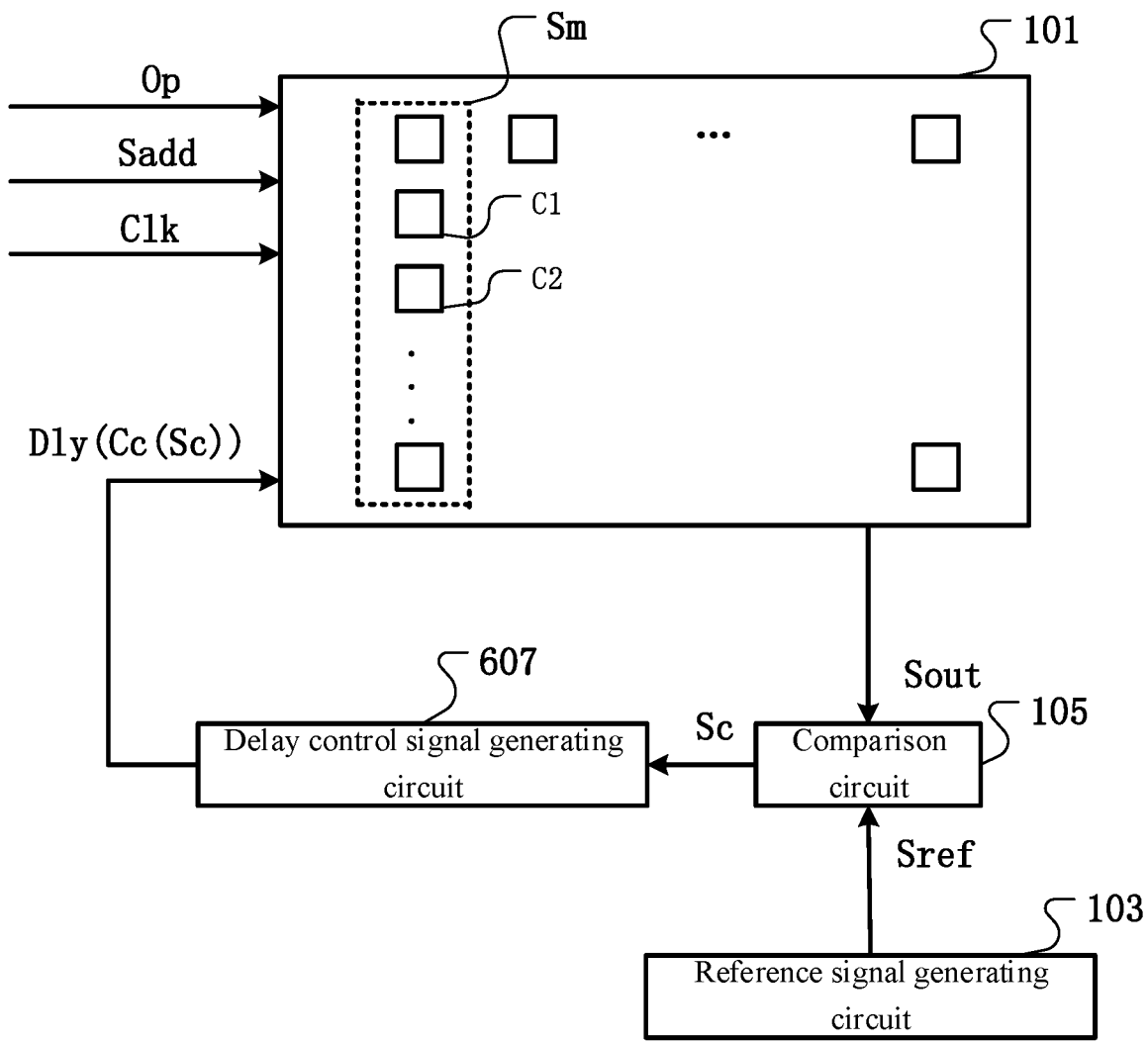
FIG. 6 is an exemplary block diagram of a memory system according to an embodiment of the present disclosure.

FIG. 6 is an exemplary block diagram of a memory system 600 according to an embodiment of the present disclosure. The components of the memory system 600 that are the same as those of the memory system 100 in FIG. 1 are not described again. The memory system 600 has a delay control signal generating circuit 607. The delay control signal generating circuit 607 may generate different delay control signals Dly by using different control code Cc, thereby resulting in different output delays tod. Therefore, the delay control signal Dly may be updated according to the comparison result signal Sc, thereby obtaining the expected output delay tod, and then the reading speed of the memory system (also referred to as the reading speed of the memory) may be adjusted. The delay control signal generating circuit 607 may be implemented by, for example, a digital z-transform filter. For example, a $1/(1-z-1)$ type digital z-transform filter or a $1/(1-0.5z-1-0.5z-2)$ type digital z-transform filter.

Figure 7:
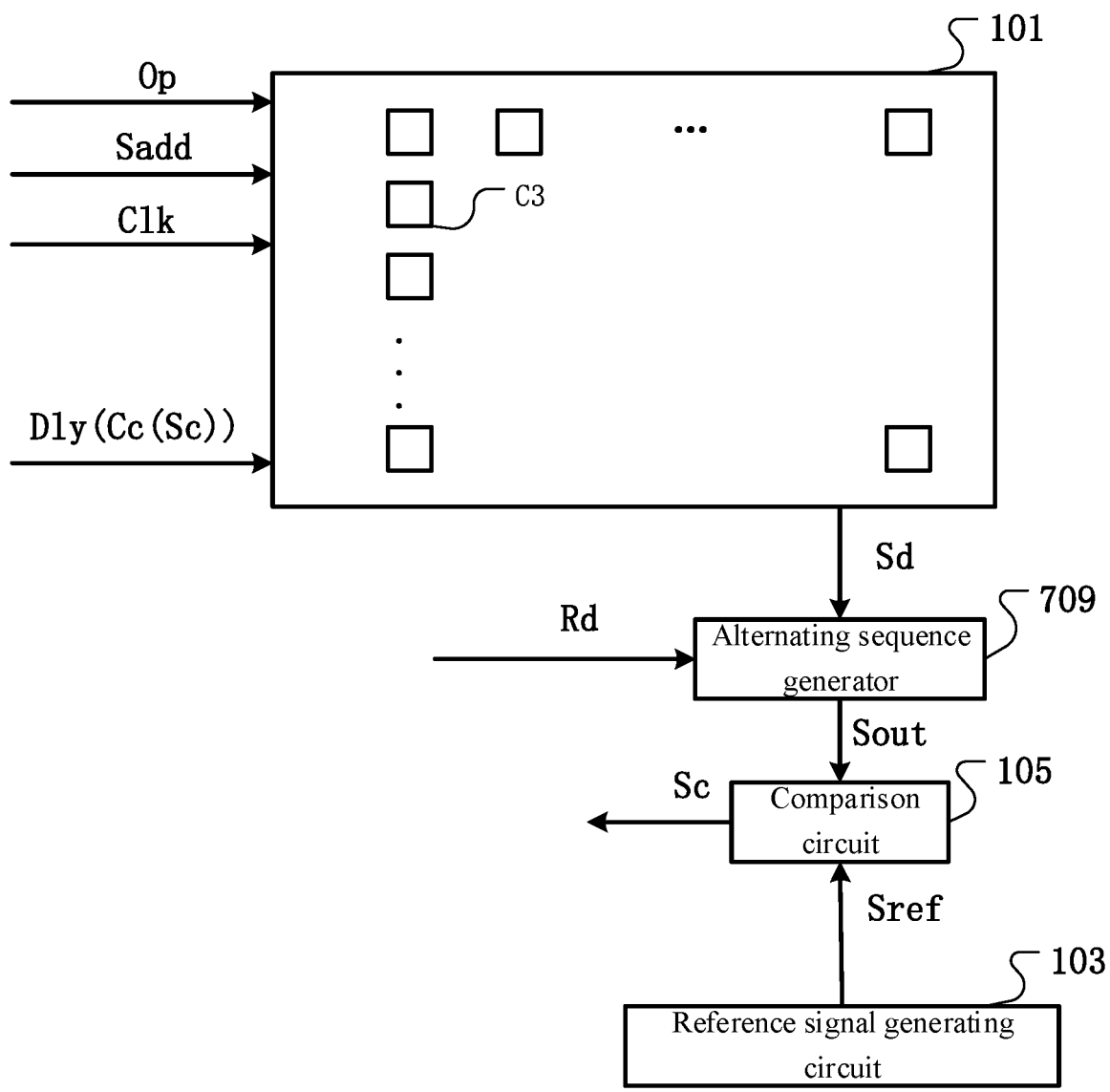
FIG. 7 is an exemplary block diagram of a memory system according to another embodiment of the present disclosure.

FIG. 7 is an exemplary block diagram of a memory system 700 according to an embodiment of the present disclosure.

The components of the memory system 700 that are the same as those of the memory system 600 in FIG. 6 are not described again. The memory system 700 has an alternating sequence generator 709, and the set of memory cells Sm is no longer required when adjusting the reading speed of the memory system. When adjusting the reading speed of the memory system, it is sufficient to read one memory cell (illustrated as a third memory cell C3 in FIG. 7). The third memory cell C3 may be a reserved memory bit for adjusting the reading speed of the memory and may be preset to a predetermined binary number when produced. The data stored in the third memory cell C3 may be a first binary number (e.g., "1") or a second binary number (e.g., "0"). The alternating sequence generator 709 receives an additional signal Rd having a predetermined timing and a data signal Sd when reading the third memory cell C3 of the memory. The alternating sequence generator 709 is configured, so that the alternating sequence generator 709 outputs an alternating sequence signal Sout, for example, the alternating sequence signal Sout is high in a first clock cycle and low in a second clock cycle, when the reading speed of the memory system is adjusted. For example, in a case where the alternating sequence generator 709 includes an RS flip-flop, a S-terminal of the RS flip-flop receives a data output signal Sd, a R-terminal of the RS flip-flop receives an additional signal Rd, and the data stored in the third memory cell C3 is "1", then, through setting the timing of the additional signal Rd, the alternating sequence signal Sout may be high in the first clock cycle and low in the second clock cycle.

Although the memory illustrated as an example and the alternating sequence generator are separate in FIG. 7, optionally, the alternating sequence generator may be integrated in the memory.

A memory system 800 according to the present disclosure, which is capable of adjusting the reading speed of the memory system, is described below with reference to FIG. 8.

Figure 8:
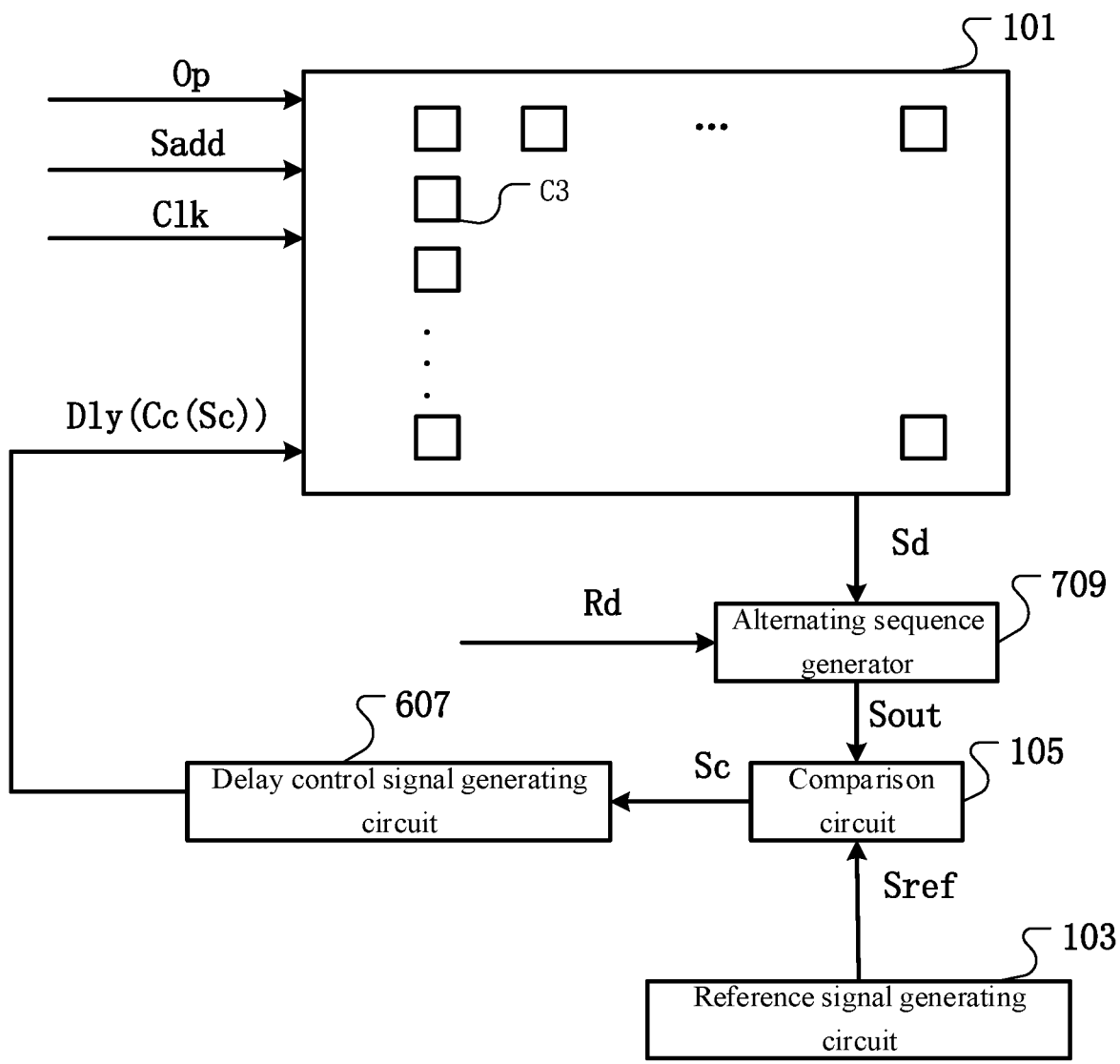
FIG. 8 is an exemplary block diagram of a memory system according to still another embodiment of the present disclosure.

FIG. 8 is an exemplary block diagram of a memory system 800 according to an embodiment of the present disclosure. The parts of the memory system 800 that are the same as those of the memory system 700 in FIG. 7 are not described again. The memory system 800 has a delay control signal generating circuit 607. Upon reading data normally, the delay control signal generating circuit 607 generates a delay control signal Dly, and an output delay of the alternating sequence signal Sout caused by the delay control signal Dly may be a specified value. The delay control signal Dly may be, for example, determined by the control code Cc stored in the delay control signal generating circuit 607, or given by a memory controller. After the delay control signal generating circuit 607 is started, the initial control code Cc may be a value stored therein or a value received from other components. The delay control signal generating circuit 607 generates an adjusted delay control signal based on a comparison result signal Sc in a case where the value indicated by the comparison result signal Sc is not a predetermined value (e.g., a zero point of the adjustment parameter n, and e.g., 00111 in Table 1), so that the corresponding adjusted output delay approaches or enters a predetermined range. For example, the adjustment parameter n is obtained from the comparison result signal Sc, and the updated control code Cc is obtained from the adjustment parameter n, i.e., Cc=Cc'+n, where Cc' is the current control code. The updated control code results in the adjusted delay control signal and results in the corresponding adjusted output delay, and the adjusted output delay may approach or enter the range trd to trd-T.

It should be noted that in a case where the permutation and combination signal Out<m:0> (m is the maximum number of flip-flops and the number starts from 0) cannot be directly used by the delay control signal generating circuit, a conversion unit may be provided in the memory system of the present disclosure, in order to convert the permutation and combination signal Out<m:0> and take the converted signal as the comparison result signal Sc. For example, the permutation and combination signal "11111" is converted to "−2" and then provided to the unit generating a delay control signal. The conversion unit may be implemented by a digital multiplexer, for example, and the alternating sequence signal and the permutation and combination signal Out<m:0> may be used as digital multiplexer control signals.

Returning to FIG. 1. When the output delay tod is smaller, the working speed of the memory 101 in the memory system 100 is higher and the power consumption is larger. When the nominal output delay tod is smaller, the yield of the memory is worse. Adjusting the output delay tod may implement the adjustment of the working speed and power consumption of the memory, so that the appropriate working speed and power consumption may be selected depending on actual needs.

Based on the above objects, the memory system of the present disclosure includes a comparison circuit. Therefore, the comparison circuit may be used to adjust the reading speed of the memory system. The adjustment method may generally include the following steps: issuing a reading instruction to the memory; generating a reference output signal Sref; generating a comparison result signal by the comparison circuit; determining an adjustment parameter n based on the comparison result signal Sc; determining control code Cc used for generating a delay control signal based on the adjustment parameter n. For example, Cc=Cc'+ n, where Cc' is the current control code. In a case where the adjustment parameter n is zero, it is indicated that the current output delay tod has satisfied the predetermined reading speed requirement, the current control code Cc may be stored, and the operation of adjusting the reading speed may be stopped (e.g., the comparison circuit is instructed to stop working). After the control code Cc satisfying the predetermined reading speed requirement is obtained, conventional data reading may be performed at the reading speed determined by the stored control code Cc. Changes in the difference Dta, the adjustment parameter n and the control code Cc are illustrated in FIG. 2.

An aspect of the present disclosure also provides a method for generating a comparison result signal. An example of the method is described below with reference to the drawings.

Figure 9:
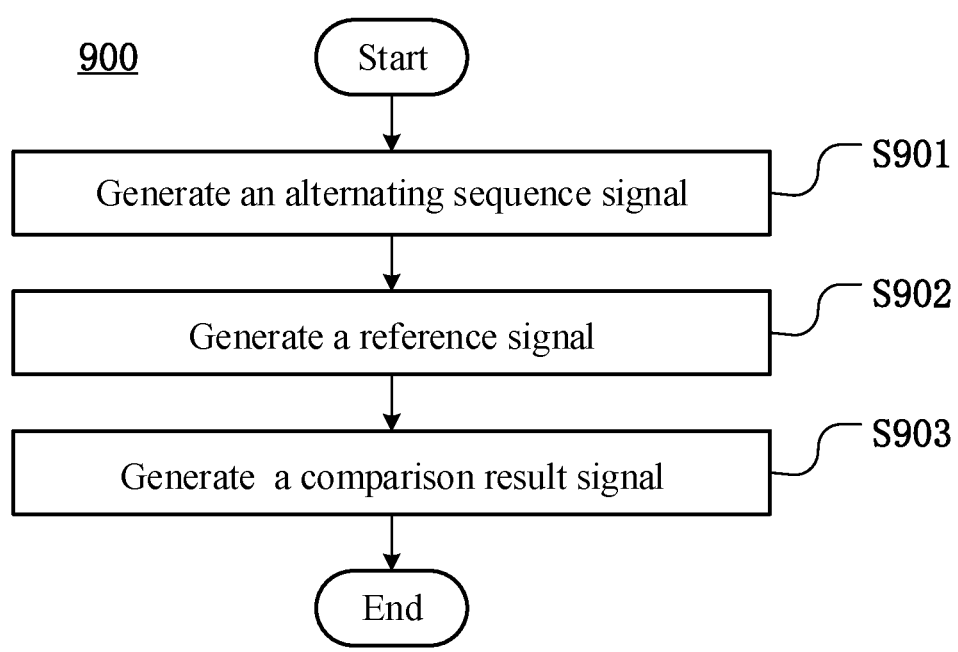
FIG. 9 is a flowchart of a method for generating a comparison result signal according to an embodiment of the present disclosure.

FIG. 9 is a flowchart of a method 900 for generating a comparison result signal which is used for adjusting a reading speed of a memory system according to an embodiment of the present disclosure.

At step S901, an alternating sequence signal Sout is generated. Specifically, an alternating sequence signal Sout in which high levels and low levels appear alternately, associated with an output delay of the memory system, is generated. The alternating sequence signal may be generated by reading, directly adjacently in time, two memory bits in the memory system that have different stored data. The alternating sequence signal may also be generated by receiving an additional signal having a predetermined timing and a data signal when reading memory bits of the memory system, which may be implemented by an alternating sequence generator.

At step S902, a reference signal Sref is generated. Specifically, a reference signal Sref in the form of a square wave having a predetermined frequency and a reference delay is generated. As illustrated in FIG. 2, the reference delay trd is an attribute parameter of the reference signal Sref.

At step S903, a comparison result signal Sc is generated. Specifically, a comparison result signal Sc indicating a range of the difference between the output delay and the reference delay is generated based on the alternating sequence signal and the reference signal. This may be implemented by a comparison circuit. The comparison circuit may be integrated in the memory system, or the comparison circuit may be designed as a separate apparatus from the memory system, and when it is necessary to determine an appropriate output delay, the comparison circuit is connected to the memory of the memory system.

An aspect of the present disclosure also provides a method for adjusting a reading speed of a memory system. An example of the method is described below with reference to the drawings.

Figure 10:
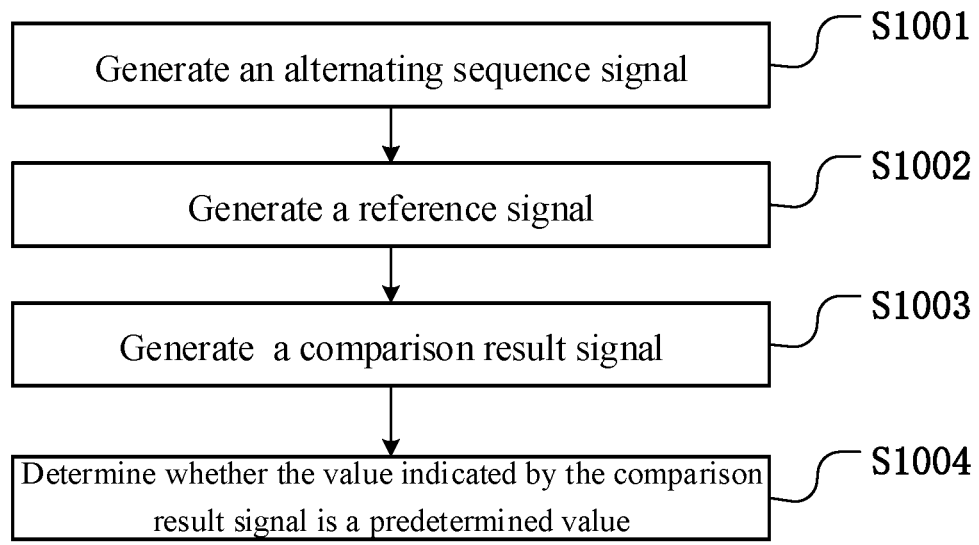
FIG. 10 illustrates main steps of a method of adjusting a reading speed of a memory system according to an embodiment of the present disclosure.

FIG. 10 illustrates main steps of a method 1000 for adjusting a reading speed of a memory system according to an embodiment of the present disclosure. The method 1000 includes steps S1001, S1002, S1003, and S1004, and steps S1001, S1002 and S1003 are the same as steps S901, S902 and S903 in the method 900, respectively. After obtaining the comparison result signal according to step S1003, various subsequent steps may be used to adjust the reading speed of the memory system. For example, in the method 1000, at step S1004, whether a value indicated by a comparison result signal is a predetermined value is determined, so as to adjust the reading speed of the memory system based on a determination result.

Figure 11:
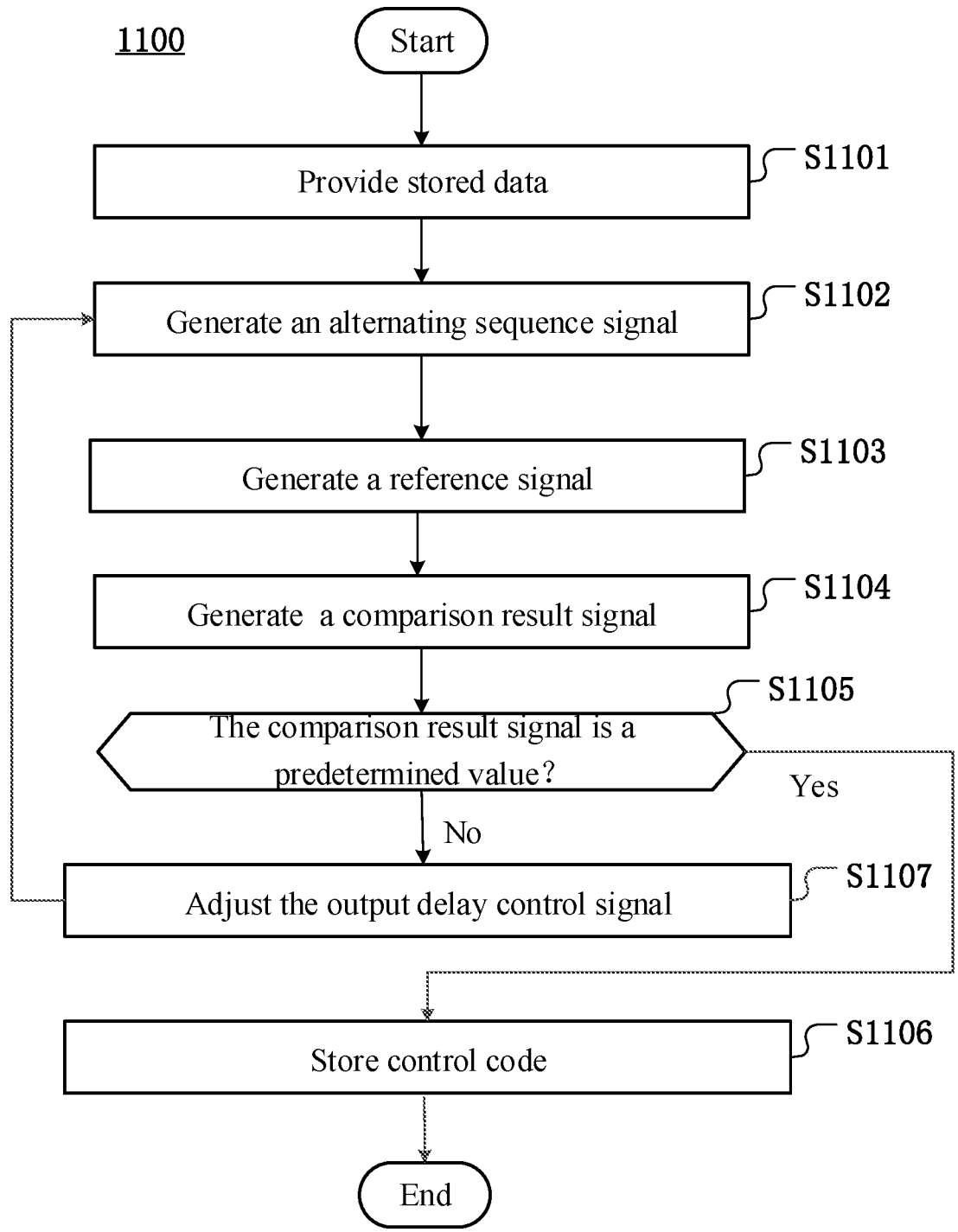
FIG. 11 is a flowchart of a method for adjusting a reading speed of a memory system according to an embodiment of the present disclosure.

FIG. 11 is a flowchart of a method 1100 for adjusting a reading speed of a memory system according to an embodiment of the present disclosure.

The method 1100 may be performed after the instruction of adjusting the reading of the memory system is received. After the method 1100 is completed, control code which determines an output delay tod satisfying expectations will be obtained, and the control code may be used to generate an appropriate delay control signal Dly. That is, when the delay control signal Dly may result in normal data reading, the output delay of the alternating sequence signal Sout is the output delay satisfying expectations, thereby the reading operation may be performed at the speed satisfying expectations.

At step S1101, stored data is provided. In a case where a set of memory cells is used, the data stored in a plurality of memory cells in the set of memory cells in the memory for adjusting the reading speed of the memory system is provided, so that when the plurality of memory cells are arranged in a predetermined memory cells sequence, a data sequence of the respective stored data of the plurality of memory cells alternately presents a first binary number and a second binary number which is different from the first binary number, and the plurality of memory cells may be reserved memory cells, and also may be ordinary memory cells. In a case where a third memory cell is used, the stored data of the third memory cell may be set to a predetermined value. The third memory cell may be a reserved memory cell and also may be an ordinary memory cell. At step S1101, in a case where the targeted memory cell is provided as a reserved memory cell, it may be selected that the stored data of the reserved memory cell are set when the memory is produced.

At step S1102, an alternating sequence signal Sout is generated, for example, this signal is an alternating sequence signal in which high levels and low levels appear alternately, associated with an output delay of the memory system. The alternating sequence signal Sout may be implemented by reading a set of memory cells Sm. The set of memory cells is read according to a predetermined memory cell sequence in order to obtain the alternating sequence signals Sout in which high levels and low levels appear alternately. Alternatively, the alternating sequence signal Sout may be implemented by an alternating sequence generator.

At step S1103, a reference signal Sref is generated, for example, this signal is a reference signal in the form of a square wave having a predetermined frequency and a reference delay. The reference delay, an attribute parameter of the reference signal Sref, may be set to a predetermined value, that is, a desired output delay.

At step S1104, a comparison result signal Sc is generated. A comparison result signal Sc indicating a range of the difference between the output delay and the reference delay is generated based on the alternating sequence signal and the reference signal. The comparison result signal Sc may be, for example, the permutation and combination signal Out<4:0> in Table 1. It should be understood that the permutation and combination mode of the outputs of each flip-flop may also be other modes, for example, Out<0>, Out<1>, Out<2>, Out<3>, Out<4> are permutated and combined in sequence.

At step S1105, it is determined whether the value indicated by the comparison result signal is a predetermined value, for example, "00111" in Table 1. The predetermined value corresponds to the zero point of the adjustment parameter n. It should be noted that although in Table 1, upward rounding is used when determining the adjustment parameter, causing 00111 to correspond to the zero point of n, downward rounding (i.e., taking the positive direction of the number axis as upward and taking the integer adjacent to the lower neighboring side of Dta) may also be used, thereby taking 00011 as the zero point of the adjustment parameter n.

If it is determined at step S1105 that the value indicated by the comparison result signal Sc is a predetermined value, the process proceeds to step S1106. At step S1106, the current control code is stored in order to be used in subsequent normal data reading (relative to the data reading when the reading speed is adjusted). The control code may determine the output delay tod corresponding to the delay control signal Dly.

If it is determined at step S1105 that the value indicated by the comparison result signal Sc is not a predetermined value, the process proceeds to step S1107. At step S1107, the output delay control signal is adjusted. The delay control signal is adjusted based on the alternating sequence signal, so that the adjusted output delay approaches or enters a predetermined range. Here, the relationship between the control code Cc of the delay control signal and the adjustment parameter n is not limited to Cc=Cc'+n. The relationship between the control code Cc and the adjustment parameter n may be in other reasonable forms, and their functional relationship may be determined according to actual situations. For example, Cc=Cc'+sign(n), where sign(n) is a positive and negative judgment function, sign(n)=1 when n is positive, sign(n)=−1 when n is negative, and sign(n)=0 when n is 0. In this case, tod=tod'-sign(n)*T, that is, when the value indicated by the comparison result signal is not a predetermined value, the output delay is always increased or decreased by a predetermined time period, in which when n is positive, the output delay is decreased, and when n is negative, the output delay is increased.

After step S1107 is completed, the process returns to step S1102 to generate a new alternating sequence signal.

TABLE 4

Changes of various parameters when the reading speed is adjusted

| tod | trd | Dta | n | Cc |
|---|---|---|---|---|
| 8.6T | 4.0T | 4.6T | 3 | 5 |
| 5.6T | 4.0T | 1.6T | 2 | 8 |
| 3.6T | 4.0T | −0.4T | 0 | 10 |

For ease of understanding, Table 4 illustrates changes of various parameters when the reading speed is adjusted. For example, the initial output delay is 8.6T, the reference delay is 4.0T, and the comparison circuit used is the comparison circuit 305. In the example of Table 4, after adjusted twice, the adjustment parameter n becomes zero, i.e., the value indicated by the comparison result signal Sc becomes the predetermined value "00111". The changes of relevant signals and parameters over time in FIG. 2 correspond to Table 4, respectively.

Returning to FIG. 2, in the example of FIG. 2, when the reading speed of the memory cells is adjusted, the output delay tod is adjusted after the time point corresponding to the slower one among the falling edges of the alternating sequence signal Sout and the reference output signal Sref, and the delay control signal Dly corresponding to the adjusted output delay is output. However, the scheme of the present disclosure is not limited to adjusting the output delay at the falling edges.

In FIG. 2, the selection that adjusting the reading speed of the memory system every two clock cycles, i.e., adjusting the output delay tod every two clock cycles is exemplary. However, the technical scheme of the present disclosure is not limited to adjusting the reading speed of the memory system every two clock cycles. The output delay tod may be adjusted every three clock cycles or more.

The present disclosure also provides a method for operating the described memory system. The method are described below with reference to FIG. 12.

Figure 12:
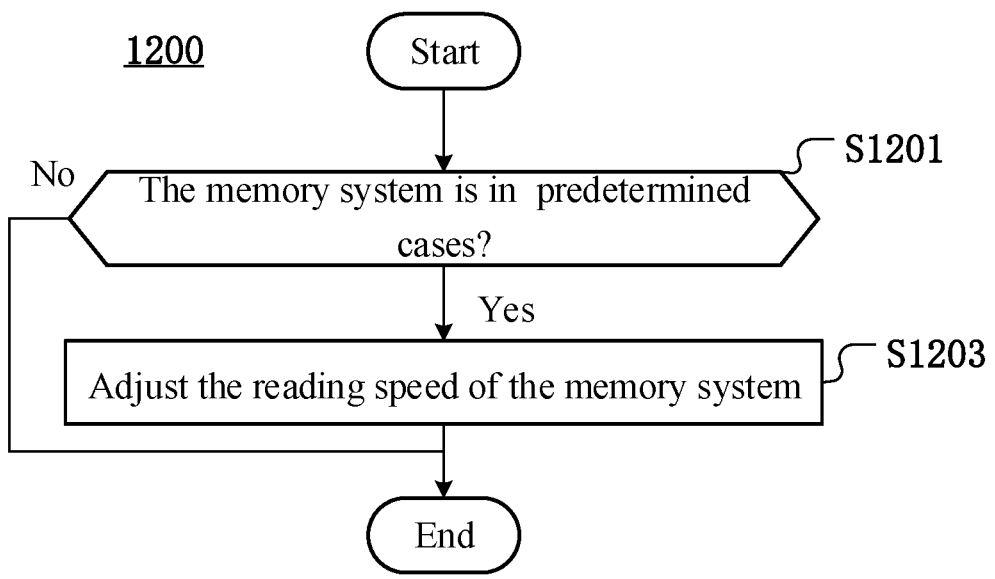
FIG. 12 is a flowchart of a method for operating a memory system according to an embodiment of the present disclosure.

FIG. 12 is a flowchart of a method 1200 for operating a memory system according to the present disclosure.

At step S1201, it is determined whether the memory system is in one of the following predetermined cases: a) the data reading state is to be in a non-speed adjustment reading state; b) a rate of change of a voltage at a power supply input terminal of the memory system is greater than a predetermined rate threshold; c) the voltage at the power supply input terminal is outside the voltage range corresponding to the current output delay; and d) the time period from the current time point to the previous time point when the reading speed of the memory system was adjusted last time is greater than a predetermined time period threshold. For case a, the purpose is to adjust the reading speed before each ordinary reading, and the ordinary reading is relative to the speed adjustment reading when the reading speed of the memory system is adjusted. For case b, the corresponding power supply fluctuates too much, and in order to ensure the accuracy of reading data and the reading speed, the reading speed is adjusted. For case c, it is considered that the reading speed is related to the power supply voltage, and when the power supply voltage changes to another range, the reading speed is adjusted accordingly. For case d, it may adjust the reading speed periodically. In addition, optionally, the reading speed of the memory system may be adjusted by the voltage or the rate of change of the voltage at the power supply input terminal of the memory.

If the determination result is "yes" at step S1201, step S1203 is performed to adjust the reading speed of the memory system.

If the determination result is "No" at step S1201, the method 1200 ends.

The present disclosure also provides a method for adjusting a reading speed of a memory system. The method are described below with reference to FIG. 13.

Figure 13:
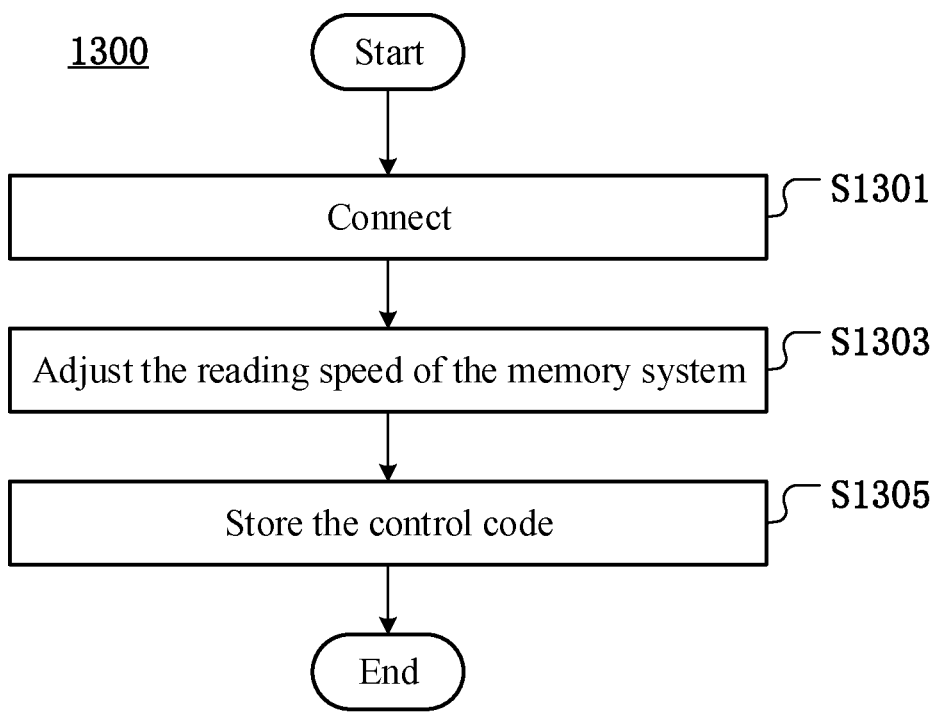
FIG. 13 is a flowchart of a method for adjusting a reading speed of a memory system according to an embodiment of the present disclosure.

FIG. 13 is a flowchart of a method 1300 for adjusting a reading speed of a memory system according to an embodiment of the present disclosure.

At step S1301, the memory system is connected to a comparison circuit of the present disclosure.

At step S1303, the reading speed of the memory system is adjusted using the connected comparison circuit until the value indicated by the comparison result signal is a predetermined value.

At step S1305, the control code determining the delay control signal is stored.

The method 1300 is particularly applicable to the case where the memory system does not have the comparison circuit of the present disclosure built in.

According to an aspect of the present disclosure, a comparison circuit that generates a comparison result signal indicating a range of the difference between a reference delay and an output delay of a memory system is provided, and the comparison circuit may receive an alternating sequence signal in which high levels and low levels appear alternately, associated with the output delay, receive a reference signal in the form of a square wave having a predetermined frequency and a reference delay, and generate a comparison result signal corresponding to the difference between the output delay and the reference delay of the reference signal based on the alternating sequence signal and the reference signal. An example of the comparison circuit may be the comparison circuit 105 in FIG. 1.

Based on the above description of specific embodiments of the present disclosure, those skilled in the art should understand that the device, memory system, method for adjusting the reading speed of the memory system and method for operating the memory system in the present disclosure may implement at least one of the following effects: determining a comparison result signal indicating a range of the difference between the current output delay and the reference delay, adjusting the reading speed of the memory system, reducing the power consumption of the memory system, improving the reading speed of the memory system and improving the yield of the memory system (or memory), and implementing automatic compromise between the dynamic power and yield.

It should be understood that the term "comprise" or "include" when used herein refers to the presence of features, integers, steps or components, but does not preclude the presence or addition of one or more other features, integers, steps or components.

It should be understood that features described and/or illustrated for an embodiment may be used in a same or similar manner in one or more other embodiments, may be combined with features in other embodiments, or may replace features in other embodiments without departing from the spirit of the present disclosure.

In addition, the methods of the present disclosure are not limited to being performed in the order described in the specification, but may be performed in other orders, in parallel, or independently, if feasible in principle. Therefore, the order of execution of the methods described in the specification does not limit the scope of the present disclosure.

The present disclosure has been described above in connection with specific embodiments, but it should be clear to those skilled in the art that these descriptions are exemplary and are not intended to limit the scope of the present disclosure. Those skilled in the art may make various variations and modifications to the present disclosure according to the spirit and principles of the present disclosure, and these variations and modifications are also within the scope of the present disclosure.

What is claimed is:

1. A method for adjusting a reading speed of a memory system, comprising:
    generating an alternating sequence signal in which high levels and low levels appear alternately, associated with an output delay of the memory system;
    generating a reference signal having a predetermined frequency and a reference delay;
    generating a comparison result signal indicating a range of a difference between the output delay and the reference delay based on the alternating sequence signal and the reference signal; and
    determining whether a value indicated by thea comparison result signal is a predetermined value, so as to adjust the reading speed of the memory system based on a determination result.

2. The method of claim 1, further comprising: in a case where the value indicated by the comparison result signal is not the predetermined value, generating an adjusted delay control signal based on the comparison result signal so that a corresponding adjusted output delay approaches or enters a predetermined range.

3. The method of claim 2, wherein generating the adjusted delay control signal based on the comparison result signal so that the corresponding adjusted output delay approaches or enters the predetermined range, comprises:
    adjusting control code used for a delay control signal based on the comparison result signal; and
    generating a new alternating sequence signal based on control code for the adjusted delay control signal.

4. The method of claim 2, wherein generating the comparison result signal indicating the range of the difference between the output delay and the reference delay based on the alternating sequence signal and the reference signal, comprises:
    delaying the reference signal and/or the alternating sequence signal for a first integer multiple of a predetermined time period.

5. The method of claim 4, wherein, in the case where the value indicated by the comparison result signal is not the predetermined value, generating the adjusted delay control signal based on the comparison result signal so that the corresponding adjusted output delay approaches or enters the predetermined range, comprises generating the adjusted delay control signal in such a manner that an output delay corresponding to the adjusted delay control signal differs from a previous output delay by a second integer multiple of the predetermined time period.

6. The method of claim 5, wherein generating the adjusted delay control signal based on the comparison result signal so that the corresponding adjusted output delay approaches or enters the predetermined range comprises: generating the adjusted delay control signal based on the comparison result signal, so that the output delay is always reduced or increased by the predetermined time period.

7. The method of claim 1, further comprising: in a case where the value indicated by the comparison result signal is the predetermined value, storing control code currently used for a delay control signal.

8. The method of claim 1, wherein an input signal of a memory of the memory system comprises a clock signal having clock cycles, and a delay control signal is adjusted every two or more of the clock cycles.

9. A memory system comprising:
    a memory, comprising a plurality of memory cells, and configured to output an alternating sequence signal having an output delay;
    a reference signal generating circuit, configured to generate a reference signal having a predetermined frequency and a reference delay;
    a comparison circuit, configured to receive the alternating sequence signal in which high levels and low levels appear alternately associated with the output delay and the reference signal, and to generate a comparison result signal indicating a range of a difference between the output delay and the reference delay based on the alternating sequence signal and the reference signal; and
    a delay control signal generating circuit, configured to generate a delay control signal used for adjusting the output delay of the memory system based on the comparison result signal, and
    wherein the memory receives the delay control signal.

10. The memory system of claim 9, wherein the delay control signal generating circuit generates an adjusted delay control signal based on the comparison result signal in a case where a value indicated by the comparison result signal is not a predetermined value, so that a corresponding adjusted output delay approaches or enters a predetermined range.

11. The memory system of claim 10, wherein the delay control signal generating circuit adjusts control code used for the delay control signal based on the comparison result signal.

12. The memory system of claim 9, further comprising:
    an alternating sequence generator, configured to receive an additional signal having a predetermined timing and a data output signal when a memory cell of the memory system is read, and to generate the alternating sequence signal.

13. The memory system of claim 9, wherein the comparison circuit comprises at least two flip-flops;
   a second input terminal of each of the at least two flip-flops receives the reference signal or a delayed signal of the reference signal; and
   a first input terminal of each of the at least two flip-flops receives the alternating sequence signal or a delayed signal of the alternating sequence signal.

14. The memory system of claim 13, wherein the comparison circuit comprises a plurality of delay units, and the plurality of delay units have a same delay time.

15. A method for operating the memory system of claim 9, comprising:
   determining whether the memory system is in one of the following predetermined situations that:
   a data reading state is to be in a non-speed adjustment reading state;
   a rate of change of a voltage at a power supply input terminal of the memory system is greater than a predetermined rate threshold;
   a voltage at a power supply input terminal is outside a voltage range corresponding to a current output delay; and
   a time period from a current time point to a previous time point when a reading speed of the memory system was adjusted last time is greater than a predetermined time period threshold.

16. The method of claim 15, further comprising:
   adjusting the reading speed of the memory system, in a case where a determination result is yes.

17. The memory system of claim 9, wherein the comparison circuit is further configured to receive a reference signal having a predetermined frequency and the reference delay, and to generate a comparison result signal based on an alternating sequence signal and a reference signal; and
   wherein the memory system outputs a data signal with the output delay when a reading operation is performed on the memory system.

18. The memory system of claim 17, wherein the comparison circuit comprises at least two flip-flops; and
   wherein a second input terminal of each of the at least two flip-flops is configured to receive the reference signal or a delayed signal of the reference signal;
   a first input terminal of each of the at least two flip-flops is configured to receive a data output signal or a delayed signal of the data output signal, and
   the comparison circuit comprises a plurality of delay units, and the plurality of delay units have a same delay time.

19. A method for adjusting a reading speed of a memory system, comprising:
   connecting the memory system to a comparison circuit; and
   adjusting the reading speed of the memory system until a value indicated by a comparison result signal is a predetermined value; and
   wherein the comparison circuit receives an alternating sequence signal in which high levels and low levels appear alternately, associated with an output delay of the memory system and a reference signal having a reference delay, and generates the comparison result signal indicating a range of a difference between the output delay and the reference delay based on the alternating sequence signal and the reference signal; and
   wherein the reference signal is a signal having a predetermined frequency.

20. The method of claim 19, further comprising:
   storing control code used for determining a delay control signal.

* * * * *